United States Patent
Lin

(10) Patent No.: US 10,715,038 B1
(45) Date of Patent: Jul. 14, 2020

(54) APPARATUS AND METHOD FOR FREQUENCY QUINTUPLING

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/699,232

(22) Filed: Nov. 29, 2019

(51) Int. Cl.
*H02M 3/07* (2006.01)
*H03L 7/099* (2006.01)

(52) U.S. Cl.
CPC ............ *H02M 3/07* (2013.01); *H03L 7/0998* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,567,971 B1* | 5/2003 | Banzhaf | ................. | G06F 30/30 |
| | | | | 716/104 |
| 8,384,459 B2* | 2/2013 | Hsu | ................ | H03H 11/265 |
| | | | | 327/231 |
| 8,638,141 B1* | 1/2014 | Lamanna | ................ | H03L 7/093 |
| | | | | 327/156 |
| 8,803,583 B2* | 8/2014 | Nedachi | ................ | H03K 5/135 |
| | | | | 327/251 |
| 8,981,828 B2* | 3/2015 | Jang | ................ | H03K 5/15 |
| | | | | 327/258 |
| 9,007,131 B2* | 4/2015 | Mirzaei | ................ | H03L 7/085 |
| | | | | 327/156 |
| 9,590,640 B1* | 3/2017 | Hsieh | ................ | H03K 5/135 |
| 10,270,456 B1* | 4/2019 | Lin | ................ | H04L 27/148 |
| 10,411,680 B1* | 9/2019 | Lin | ................ | H03K 5/00006 |
| 2001/0026179 A1* | 10/2001 | Saeki | ................ | H03K 5/135 |
| | | | | 327/147 |
| 2004/0174222 A1* | 9/2004 | Rosnell | ................ | H03K 5/159 |
| | | | | 332/144 |
| 2005/0110539 A1* | 5/2005 | Lee | ................ | H03L 7/0814 |
| | | | | 327/158 |
| 2006/0170459 A1* | 8/2006 | Shin | ................ | H03K 17/693 |
| | | | | 326/113 |
| 2007/0170979 A1* | 7/2007 | Campardo | ................ | H02M 3/07 |
| | | | | 327/536 |
| 2009/0179674 A1* | 7/2009 | Tamura | ................ | H04L 7/033 |
| | | | | 327/155 |

(Continued)

*Primary Examiner* — Adam D Houston
(74) *Attorney, Agent, or Firm* — McClure, Qualey & Rodack, LLP

(57) ABSTRACT

A circuit includes a first TSCP (tri-stage charge pump), a second TSCP, a third TSCP, a fourth TSCP, a fifth TSCP, and a load. The first TSCP receives a first phase and a third phase of a five-phase clock and outputs a first current to an output node. The second TSCP receives a second phase and a fourth phase of the five-phase clock and outputs a second current to the output node. The third TSCP receives a third phase and a fifth phase of the five-phase clock and outputs a third current to the output node. The fourth TSCP receives a fourth phase and the first phase of the five-phase clock and outputs a fourth current to the output node. The fifth TSCP receives a fifth phase and the second phase of the five-phase clock and outputs a fifth current to the output node. The load terminates the output node.

14 Claims, 4 Drawing Sheets

(56) References Cited

U.S. PATENT DOCUMENTS

| | | | |
|---|---|---|---|
| 2010/0097112 A1* | 4/2010 | Panditd | H03K 5/1565 |
| | | | 327/175 |
| 2010/0253382 A1* | 10/2010 | Wang | G01R 31/3187 |
| | | | 324/762.09 |
| 2011/0140746 A1* | 6/2011 | Park | H03L 7/099 |
| | | | 327/156 |
| 2011/0241746 A1* | 10/2011 | Fu | H03H 11/265 |
| | | | 327/276 |
| 2011/0309888 A1* | 12/2011 | Bulzacchelli | H03L 7/0995 |
| | | | 331/109 |
| 2012/0038396 A1* | 2/2012 | Shima | H03L 7/08 |
| | | | 327/117 |
| 2012/0038404 A1* | 2/2012 | Yong | H03K 5/1565 |
| | | | 327/175 |
| 2012/0286838 A1* | 11/2012 | Hsu | H03H 11/265 |
| | | | 327/231 |
| 2015/0318981 A1* | 11/2015 | Zhou | H04L 7/0025 |
| | | | 375/376 |
| 2015/0381191 A1* | 12/2015 | Wu | H03L 7/16 |
| | | | 331/1 R |
| 2016/0173099 A1* | 6/2016 | de Oliveira | H03K 3/356017 |
| | | | 331/57 |
| 2016/0249004 A1* | 8/2016 | Saeki | H03L 7/08 |
| 2016/0352328 A1* | 12/2016 | Sonntag | H02M 3/07 |
| 2017/0149422 A1* | 5/2017 | Ma | H03K 5/135 |
| 2018/0034468 A1* | 2/2018 | Faisal | H03L 7/081 |

\* cited by examiner

US 10,715,038 B1

APPARATUS AND METHOD FOR FREQUENCY QUINTUPLING

BACKGROUND OF THE DISCLOSURE

Field of the Disclosure

The present disclosure generally relates to frequency quintupling, and more particularly to a circuit and method of frequency quintupling having reduced VCO pulling and frequency modulation of the noise.

Description of Related Art

A frequency quintupling apparatus receives an input clock of a fundamental frequency and outputs an output clock having a frequency that is five times higher than the fundamental frequency (i.e., a quintuple frequency). For instance, if the fundamental frequency is 2 GHz, then the quintuple frequency is 10 GHz. Frequency quintupling is usually accomplished using a phase lock loop. A phase lock loop comprises: a frequency/phase detector configured to receive the input clock and a divided-down clock and output a phase error signal; a loop filter configured to receive the phase error signal and output a control voltage; a VCO (voltage-controlled oscillator) configured to receive the control voltage and output the output clock; and a divide-by-5 circuit configured to receive the output clock and output the divided-down clock, such that a frequency of the divided-down clock is one fifth of the frequency of the output clock.

Phase lock loops are well known to those of ordinary skill in the art and thus not described in detail here. In the phase lock loop, the VCO is subject to an issue known as "VCO pulling," wherein the oscillation frequency of the VCO is pulled by an interfering signal of a frequency close to a natural oscillation frequency of the VCO, instead of being controlled by the control voltage. Besides, the VCO is subject to undesired frequency modulation caused by a noise of a power supply of the VCO.

What is desired is an improved method of frequency quintupling that has reduced VCO pulling and frequency modulation of the noise.

BRIEF DESCRIPTION OF THIS DISCLOSURE

In an embodiment, a circuit includes a first TSCP (tri-stage charge pump), a second TSCP, a third TSCP, a fourth TSCP, a fifth TSCP, and a load. The first TSCP receives a first phase and a third phase of a five-phase clock and outputs a first current to an output node. The second TSCP receives a second phase and a fourth phase of the five-phase clock and outputs a second current to the output node. The third TSCP receives a third phase and a fifth phase of the five-phase clock and outputs a third current to the output node. The fourth TSCP receives a fourth phase and the first phase of the five-phase clock and outputs a fourth current to the output node. The fifth TSCP receives a fifth phase and the second phase of the five-phase clock and outputs a fifth current to the output node. The load terminates the output node.

In an embodiment, a method includes the following steps: receiving a five-phase clock including a first phase, a second phase, a third phase, a fourth phase, and a fifth phase; using a first tri-state charge pump (TSCP) to output a first current to an output node in accordance with the first phase and the third phase of the five-phase clock; using a second TSCP to output a second current to the output node in accordance with the second phase and the fourth phase of the five-phase clock; using a third TSCP to output a third current to the output node in accordance with the third phase and the fifth phase of the five-phase clock; using a fourth TSCP to output a fourth current to the output node in accordance with the fourth phase and the first phase of the five-phase clock; using a fifth TSCP to output a fifth current to the output node in accordance with the fifth phase and the second phase of the five-phase clock; and terminating the output node with a load.

DETAILED DESCRIPTION OF THIS DISCLOSURE

Figure 1:
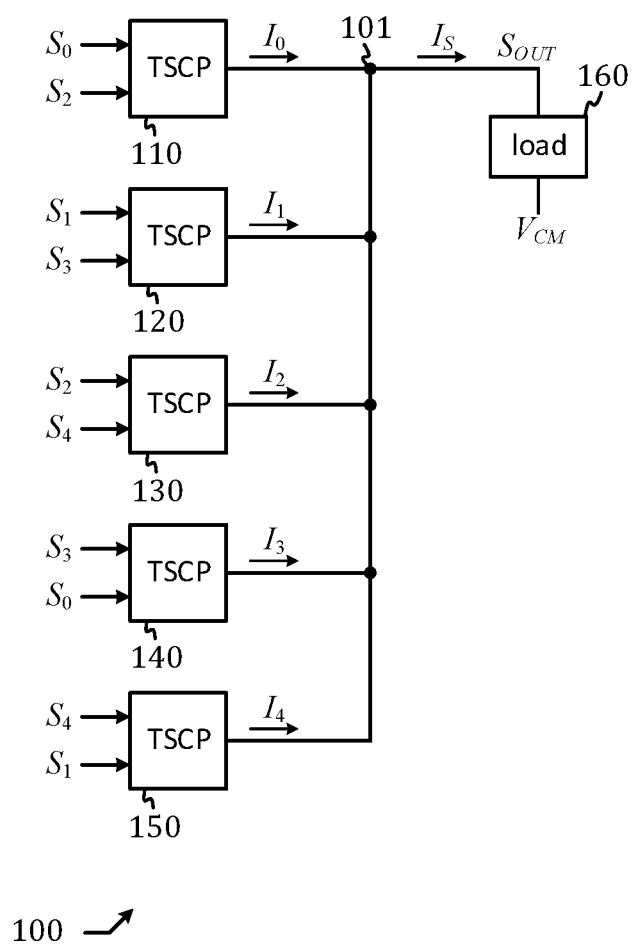
FIG. 1 shows a functional block diagram of a frequency quintupling circuit in accordance with an embodiment of the present disclosure.

The present disclosure is directed to frequency quintupling. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "node," "power supply node," "ground," "signal," "logical signal," "logical inversion," "clock," "frequency," "period," "phase," "CMOS (complementary metal oxide semiconductor)," "NMOS (N-channel metal oxide semiconductor) transistor," "PMOS (N-channel metal oxide semiconductor) transistor," "single-ended," "differential," "charge pump," "cascode amplifier," "DC (direct current)." Terms like these are used routinely in the context of microelectronics, and the associated concepts are apparent to those of ordinary skills in the art and thus will not be explained in detail here. Those of ordinary skill in the art can also recognize symbols like those of a NMOS transistor and a symbol of a PMOS transistor and identify the "source," the "gate," and the "drain" terminals thereof. Those of ordinary skills in the art also can read schematics of a circuit comprising NMOS transistors and/or PMOS transistors without the need of a verbose description about how one transistor connects with another in the schematics. Those of ordinary skills in the art also understand units such as micron and nanometer.

This present disclosure is disclosed in an engineering sense (i.e., from the perspective of persons skilled in the art). For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

In this disclosure, a signal is either a voltage or a current that represents an information.

A logical signal is a voltage signal of two possible states: a high state and a low state. A logical signal is said to be in the high (low) state when a level of said logical signal is above (below) a certain trip point pertaining to said logical signal. When it is said that "(the logical signal) X is high," it is stating it in a context of logical signal and what is meant is: "X is in the high state." When it is said that (the logical signal) X is low," it is stating it in a context of logical signal and what is meant is: "X is in the low state." The high state is also known as the "1" state, and the low state is also known as the "0" state. When it is stated that "(the logical signal) X is 1," it is stating it in a context of logical signal and what we mean is: "X is in the high state." Likewise, when it is stated that "(the logical signal) X is 0," it is stating it in a context of logical signal and what we mean is: "X is in the low state."

A first logical signal is said to be a logical inversion of a second logical signal provided the first logical signal and the second logical signal are always of opposite states, i.e. when one of them is 1, the other will be 0.

When a first logical signal is a logical inversion of a second logical signal, the first logical signal and the second logical signal are said to be complementary.

When a first current is said to be an inversion of a second current, the first current and the second current are of approximately the same magnitude but opposite signs.

A "clock signal" (or simply a "clock") is a logical signal that cyclically toggles between a low state and a high state.

Throughout this disclosure, "$V_{DD}$" denotes a power supply node. For convenience, "$V_{DD}$" can also refer to a power supply voltage provided at the power supply node. That is, "$V_{DD}$ is 0.9V" means "a power supply voltage at the power supply node $V_{DD}$ is 0.9V." By way of example but not limitation, throughout this disclosure a circuit is fabricated using a 28 nm CMOS (complementary metal oxide semiconductor) process and $V_{DD}$ is 0.9V.

Throughout this disclosure, "$V_{SS}$" denotes a DC (direct current) ground node. A voltage at "$V_{SS}$" is nominally 0V.

This present disclosure discloses a frequency quintupling circuit that can be embodied by either a single-ended circuit or a differential circuit. A single-ended circuit embodiment will be described first, then a full-differential circuit embodiment will be described.

A functional block diagram of a single-ended frequency quintupling circuit 100 in accordance with an embodiment of the present disclosure is shown in FIG. 1. For brevity, hereafter the single-ended frequency quintupling circuit 100 is simply referred to as circuit 100. Circuit 100 receives a five-phase input clock comprising a first phase $S_0$, a second phase $S_1$, a third phase $S_2$, a fourth phase $S_3$, and a fifth phase $S_4$ and output an output clock $S_{OUT}$. For brevity, hereafter the first (second, third, fourth, fifth) phase $S_0$ ($S_1$, $S_2$, $S_3$, $S_4$) is simply referred to as $S_0$ ($S_1$, $S_2$, $S_3$, $S_4$). Circuit 100 comprises: a first tri-stage charge pump 110 (hereafter TSCP for short) configured to receive $S_0$ and $S_2$ and output a first current $I_0$ to an output node 101; a second TSCP 120 configured to receive S and $S_3$ and output a second current $I_2$ to the output node 101; a third TSCP 130 configured to receive $S_2$ and $S_4$ and output a third current $I_3$ to the output node 101; a fourth TSCP 140 configured to receive $S_3$ and $S_0$ and output a fourth current $I_4$ to the output node 101; a fifth TSCP 150 configured to receive $S_4$ and $S_1$ and output a fifth current $I_4$ to the output node 101; and a load 160 configured to terminate the output node 101 and establish the output clock $S_{OUT}$. Here, "$V_{CM}$" denotes a DC (direct current) node.

Let a period of the five-phase input clock be T. Mathematically, the five-phase input clock can be represented by the following equations:

$$S_0 = \begin{cases} 1 & \text{if } 0 \leq \text{mod}(t, T) < T/2 \\ 0 & \text{else} \end{cases} \quad (1)$$

$$S_1 = \begin{cases} 1 & \text{if } T/5 \leq \text{mod}(t, T) < 7T/10 \\ 0 & \text{else} \end{cases} \quad (2)$$

$$S_2 = \begin{cases} 1 & \text{if } 2T/5 \leq \text{mod}(t, T) < 9T/10 \\ 0 & \text{else} \end{cases} \quad (3)$$

$$S_3 = \begin{cases} 1 & \text{if } 0 \leq \text{mod}(t, T) < T/10 \text{ or } 3T/5 \leq \text{mod}(t, T) < T \\ 0 & \text{else} \end{cases} \quad (4)$$

$$S_4 = \begin{cases} 1 & \text{if } 0 \leq \text{mod}(t, T) < 3T/10 \text{ or } 4T/5 \leq \text{mod}(t, T) < T \\ 0 & \text{else} \end{cases} \quad (5)$$

Here, "t" is a time variable, "mod(•, •)" denotes a modulo function, and mod(t,T) is equal to a remainder after division of t by T.

Mathematically, TSCP 110 embodies the following equation:

$$I_0 = \begin{cases} I_E & \text{if } S_0 = 0 \text{ and } S_2 = 0 \\ -I_E & \text{else if } S_0 = 1 \text{ and } S_2 = 1 \\ 0 & \text{else} \end{cases} \quad (6)$$

Here, "$I_E$" denotes a current value. When $S_0$ and $S_2$ are both 0, TSCP 110 outputs a positive current; when $S_0$ and $S_2$ are both 1, TSCP 110 outputs a negative current; otherwise, TSCP 110 outputs a zero current. Likewise, TSCP 120, 130, 140, and 150 embody the following equations, respectively:

$$I_1 = \begin{cases} I_E & \text{if } S_1 = 0 \text{ and } S_3 = 0 \\ -I_E & \text{else if } S_1 = 1 \text{ and } S_3 = 1 \\ 0 & \text{else} \end{cases} \quad (7)$$

$$I_2 = \begin{cases} I_E & \text{if } S_2 = 0 \text{ and } S_4 = 0 \\ -I_E & \text{else if } S_2 = 1 \text{ and } S_4 = 1 \\ 0 & \text{else} \end{cases} \quad (8)$$

$$I_3 = \begin{cases} I_E & \text{if } S_3 = 0 \text{ and } S_0 = 0 \\ -I_E & \text{else if } S_3 = 1 \text{ and } S_0 = 1 \\ 0 & \text{else} \end{cases} \quad (9)$$

$$I_4 = \begin{cases} I_E & \text{if } S_4 = 0 \text{ and } S_1 = 0 \\ -I_E & \text{else if } S_4 = 1 \text{ and } S_1 = 1 \\ 0 & \text{else} \end{cases} \quad (10)$$

$S_0$, $S_1$, $S_2$, $S_3$, and $S_4$ are summed at the output node 101, resulting a summed current $I_S$. By applying equations (1), (2), (3), (4), (5), (6), (7), (8), (9), and (10), a tabulated value of $I_S$ over a period of the five-phase clock is as follows:

| t | $I_0$ | $I_1$ | $I_2$ | $I_3$ | $I_4$ | $I_S$ |
|---|---|---|---|---|---|---|
| $0 \leq \text{mod}(t, T) < T/10$ | 0 | 0 | 0 | $-I_E$ | 0 | $-I_E$ |
| $T/10 \leq \text{mod}(t, T) < T/5$ | 0 | $I_E$ | 0 | 0 | 0 | $I_E$ |

-continued

| t | $I_0$ | $I_1$ | $I_2$ | $I_3$ | $I_4$ | $I_5$ |
|---|---|---|---|---|---|---|
| T/5 ≤ mod(t, T) < 3T/10 | 0 | 0 | 0 | 0 | $-I_E$ | $-I_E$ |
| 3T/10 ≤ mod(t, T) < 2T/5 | 0 | 0 | $I_E$ | 0 | 0 | $I_E$ |
| 2T/5 ≤ mod(t, T) < T /2 | $-I_E$ | 0 | 0 | 0 | 0 | $-I_E$ |
| T/2 ≤ mod(t, T) < 3T/5 | 0 | 0 | 0 | $I_E$ | 0 | $I_E$ |
| 3T/5 ≤ mod(t, T) < 7T/10 | 0 | $-I_E$ | 0 | 0 | 0 | $-I_E$ |
| 7T/10 ≤ mod(t, T) < 4T/5 | 0 | 0 | 0 | 0 | $I_E$ | $I_E$ |
| 4T/5 ≤ mod(t, T) < 9T/10 | 0 | 0 | $-I_E$ | 0 | 0 | $-I_E$ |
| 9T/10 ≤ mod(t, T) < T | $I_E$ | 0 | 0 | 0 | 0 | $I_E$ |

As shown, the summed current $I_S$ is periodic, and there are five cycles of $I_S$ for every cycle of the five-phase input clock. A frequency quintupling function is thus fulfilled. The load 160 presents an impedance at the output node 101 and effectively converts the summed current $I_S$ into the output clock $S_{OUT}$:

$$S_{OUT} = I_S Z_L \qquad (10)$$

Here, $Z_L$ is an impedance of the load 160. The output clock $S_{OUT}$, therefore, is of a quintuple frequency.

Figure 2:
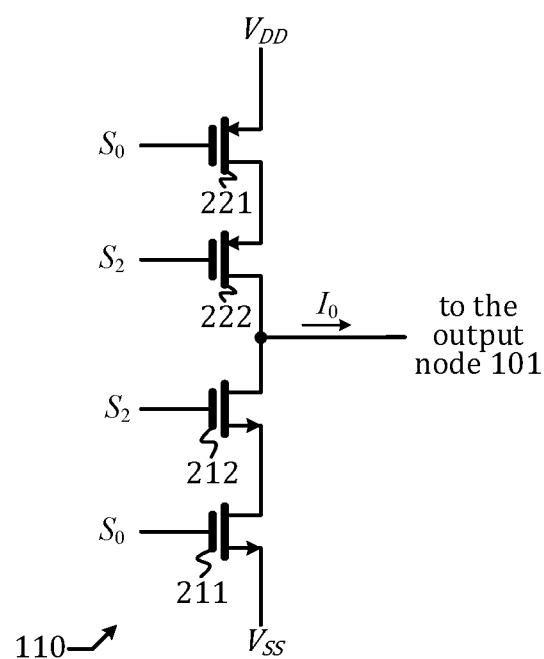
FIG. 2 shows a schematic diagram of a tri-state charge pump in accordance with an embodiment of the present disclosure.

As schematic diagram of TSCP 110 in accordance with an embodiment of the present disclosure is shown in FIG. 2. As shown, the TSCP 110 comprises NMOS transistors 211 and 212 controlled by $S_0$ and $S_2$, respectively, and configured in a cascode topology and PMOS transistors 221 and 222 controlled by $S_0$ and $S_2$, respectively, and configured in a cascode topology. When $S_0$ and $S_2$ are both 0 (i.e. low), NMOS transistors 211 and 212 are both turned off, while PMOS transistors 221 and 222 are both turned on to source a current from "$V_{DD}$" to the output node 101, resulting in a positive value of $I_0$; when $S_0$ and $S_2$ are both 1 (i.e. high), PMOS transistors 221 and 222 are both turned off, while NMOS transistors 211 and 212 are both turned on to sink current from the output node 101 to "$V_{SS}$," resulting in a negative value of $I_0$; otherwise, there is no current conduction path between "$V_{DD}$" and the output node 101 and no current conduction path between "$V_{SS}$" and the output node 101, resulting in a zero value of $I_0$. Verbose descriptions regarding inter-connection between devices and/or nodes, such as "the source of NMOS transistor 212 connects to the drain of NMOS transistor 211; the gate of NMOS transistor 212 connects to $S_2$; the drain of NMOS transistor 212 connects to the drain of PMOS transistor 222 and also connects to the output node 101" are not necessary as they are obvious to those of ordinary skills in the art.

The circuit of TSCP 110 in FIG. 2 can be used to embody TSCP 120 (130, 140, 150) by replacing $S_0$ and $S_2$ with $S_1$ ($S_2$, $S_3$, $S_4$) and $S_3$ ($S_4$, $S_0$, $S_1$), respectively.

In an embodiment, the load 160 is not an explicit circuit element, but a parasitic capacitance at the output node 101. In this case, "$V_{CM}$" is not an explicit circuit node.

In an embodiment, the load 160 is a resonant tank comprising a parallel connection of an inductor and a capacitor configured to have a resonance and thus can provide a high impedance at the quintuple frequency. In this case, the DC node "$V_{CM}$" defines a common-mode voltage of $S_{OUT}$.

Figure 3:
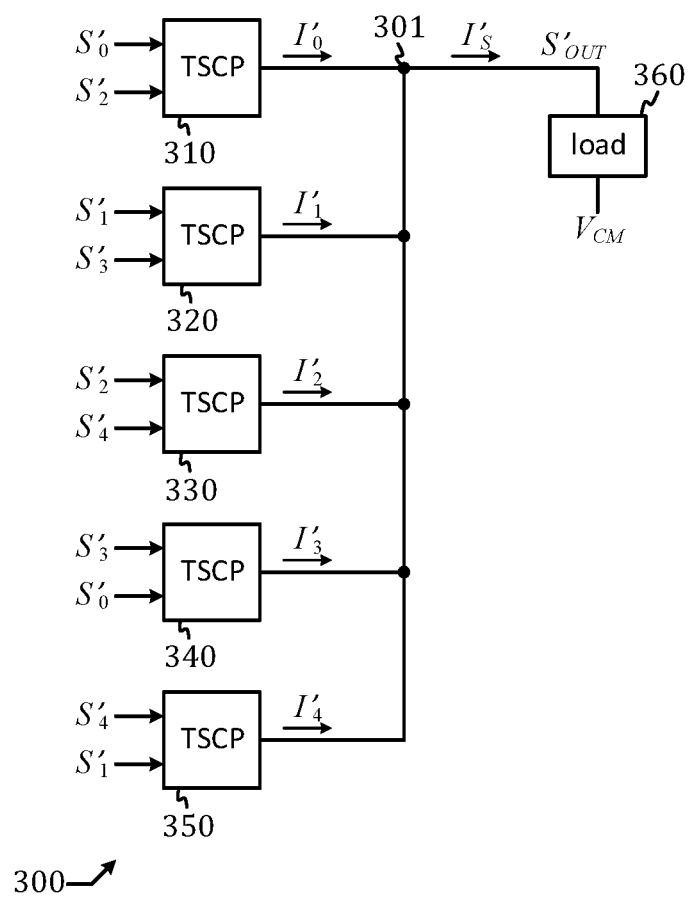
FIG. 3. shows a functional block diagram of a frequency quintupling circuit that together with the frequency quintupling circuit of FIG. 1 can embody a differential frequency quintupling circuit.

Consistent with the scope and spirit of the invention, a differential frequency quintupling circuit can be embodied using two single-ended quintupling circuits including a first single-ended quintupling circuit and a second single-ended quintupling circuit, wherein the two single-ended quintupling circuits are of the same circuit but complementary signals. The first single-ended quintupling circuit can be embodied using circuit 100 of FIG. 1. The second single-ended circuit can be embodied using circuit 300 shown in FIG. 3, which is the same as circuit 100 of FIG. 1 except: $S_0$, $S_1$ $S_2$, $S_3$, and $S_4$ are replaced by $S'_0$, $S'_1$, $S'_2$, $S'_3$, and $S'_4$, respectively; TSCP 110, 120, 130, 140, and 150 are replaced by TSCP 310, 320, 330, 340, and 350, respectively; $I_0$, $I_1$, $I_2$, $S_3$, and $S_4$ are replaced by $I'_0$, $I'_1$, $I'_2$, $I'_3$, and $I'_4$, respectively; the output node 101 is replaced by a complementary output node 301; the load 160 is replaced by a complementary load 360; and the output clock Sour is replaced by a complementary output clock $S'_{OUT}$. Here, $S'_0$, $S'_1$, $S'_2$, $S'_3$, and $S'_4$ are logical inversions of $S_0$, $S_1$ $S_2$, $S_3$, and $S_4$, respectively, and consequently $I'_0$, $I'_1$, $I'_2$, $I'_3$, and $I'_4$ are inversions of $I_0$, $I_1$, $I_2$, $S_3$, and $S_4$, respectively and so is the complementary output clock $S'_{OUT}$ an inversion of the output clock clock $S_{OUT}$.

In an embodiment, the five-phase input clock Sour is generated by a five-stage delay lock loop. That a five-stage delay lock loop can generate a five-phase clock is well known in the prior art and thus not described in detail here.

In an embodiment, the five-phase input clock $S_{OUT}$ is generated by a five-stage ring oscillator. That a five-stage ring oscillator can generate a five-phase clock is well known in the prior art and thus not described in detail here. In an embodiment, the five-stage ring oscillator is a voltage-controlled oscillator controlled in a closed loop manner in a phase lock loop. A phase lock loop is well known in the prior art and thus not described in detail here. The voltage-controlled oscillator is not subject to "VCO pulling" provided the interfering signal is at the quintupling frequency.

In an embodiment, the five-phase input clock $S_{OUT}$ is derived from a four-phase clock by performing a phase interpolation. Phase interpolation is a method for generating a clock of any phase. Phase interpolation can be embodied using a weighted sum in accordance with a weight that determines a target phase after the interpolation. An example of phase interpolation using a weighted sum can be found in U.S. Pat. No. 10,270,456.

A whole period of a periodic signal covers 360-degree phase. Therefore, a five-phase clock comprising five phases with 72-degrees spacing. Let the phase of $S_0$ be 0-degrees, then the phases of $S_1$, $S_2$, $S_3$, and $S_4$ are 72-degrees, 144-degrees, 216-degrees, and 288-degrees, respectively. An inversion of a periodic signal introduces 180-degrees phase shift, therefore the phases of $S'_0$, $S'_1$, $S'_2$, $S'_3$, and $S'_4$ are 180-degrees, 252-degrees, 324-degrees, 36-degrees, and 108-degrees, respectively. Therefore, $S_0$, $S'_3$, $S_1$, $S'_4$, $S_2$, $S'_0$, $S_3$, $S'_1$, $S_4$, and $S'_2$ form a ten-phase clock with 36-degrees spacing. In other words, a five-phase clock along with its logical inversion form a ten-phase clock. As described earlier, a differential quintupling circuit can be embodied by a combination of the single-ended quintupling circuit 100 of FIG. 1, which outputs Sour in accordance with $S_0$, $S_1$, $S_2$, $S_3$, and $S_4$, and the single-ended quintupling circuit 300 of FIG. 3, which outputs $S'_{OUT}$ in accordance with $S'_0$, $S'_1$, $S'_2$, $S'_3$, and $S'_4$, it can be stated that the differential quintupling circuit outputs $S_{OUT}$ and $S'_{OUT}$ in accordance with a ten-phase clock comprising ten phases: $S_0$, $S'_3$, $S_1$, $S'_4$, $S_2$, $S'_0$, $S_3$, $S'_1$, $S_4$, and $S'_2$.

Figure 4:
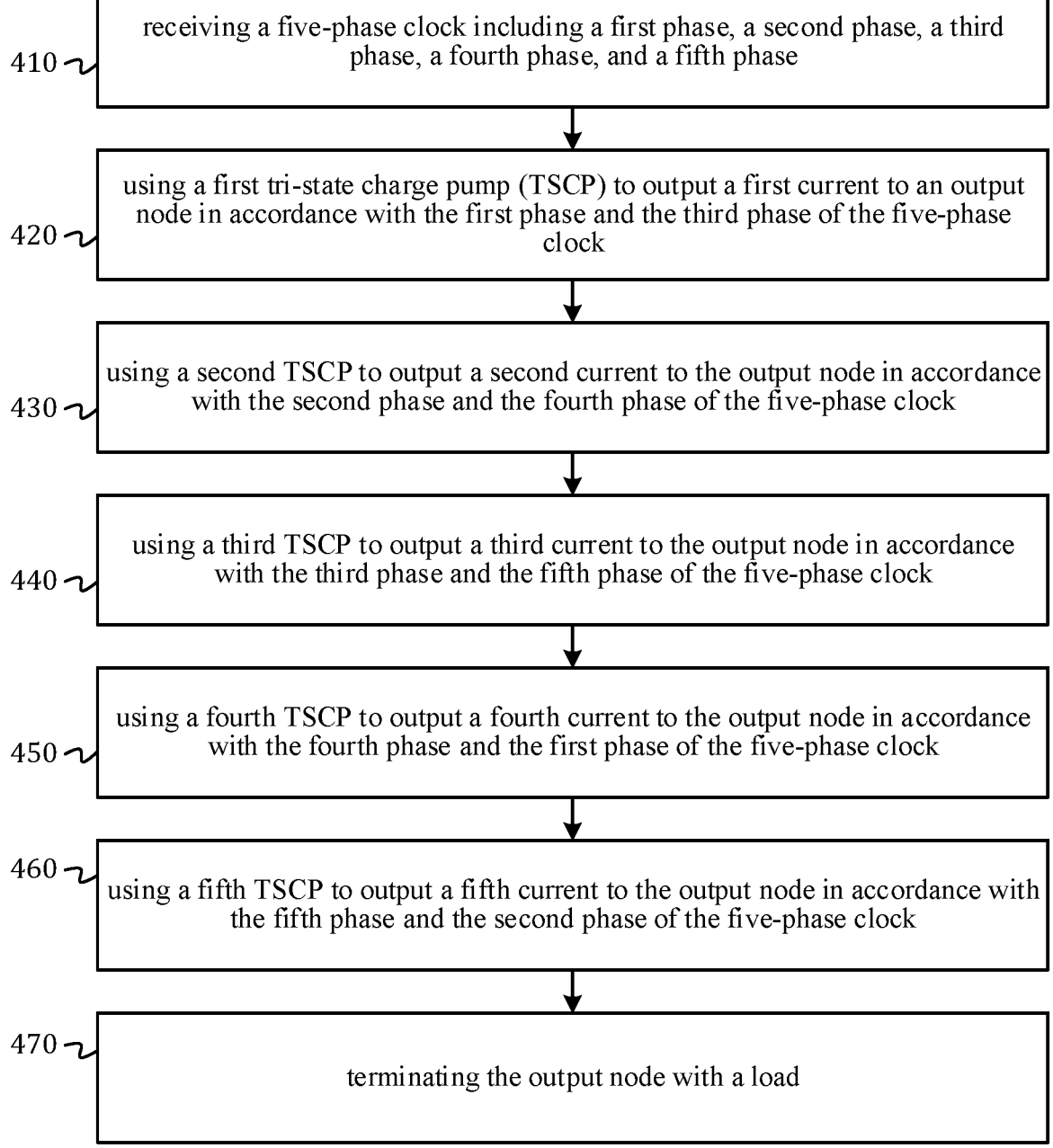
FIG. 4 shows a flow diagram of a method in accordance with an embodiment of the present disclosure.

As illustrated by a flow diagram shown in FIG. 4, a method in accordance with an embodiment of the present disclosure comprises the following steps: (step 410) receiving a five-phase clock including a first phase, a second phase, a third phase, a fourth phase, and a fifth phase; (step 420) using a first tri-state charge pump (TSCP) to output a first current to an output node in accordance with the first phase and the third phase of the five-phase clock; (step 430) using a second TSCP to output a second current to the output node in accordance with the second phase and the fourth phase of the five-phase clock; (step 440) using a third TSCP to output a third current to the output node in accordance with the third phase and the fifth phase of the five-phase clock; (step 450) using a fourth TSCP to output a fourth current to the output node in accordance with the fourth phase and the first phase of the five-phase clock; (step 460) using a fifth TSCP to output a fifth current to the output node in accordance with the fifth phase and the second phase of the five-phase clock; and (step 470) terminating the output node with a load.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A circuit comprising:
   a first TSCP (tri-stage charge pump) configured to receive a first phase and a third phase of a five-phase clock and output a first current to an output node;
   a second TSCP configured to receive a second phase and a fourth phase of the five-phase clock and output a second current to the output node;
   a third TSCP configured to receive a third phase and a fifth phase of the five-phase clock and output a third current to the output node;
   a fourth TSCP configured to receive a fourth phase and the first phase of the five-phase clock and output a fourth current to the output node;
   a fifth TSCP configured to receive a fifth phase and the second phase of the five-phase clock and output a fifth current to the output node; and
   a load configured to terminate the output node.

2. The circuit of claim 1, wherein the first TSCP, the second TSCP, the third TSCP, the fourth TSCP, and the fifth TSCP are all embodied by a charge pump circuit that has three states including a negative output current state, a positive output current state, and a zero output current state in accordance with two control signals, each of which is a logical signal that is either in a first logical state or in a second logical state.

3. The circuit of claim 2, the charge pump circuit is in the negative output current state when the two control signals are both in a first logical state, in the positive output current state when the two control signals are both in a second logical state, and otherwise in the zero output current state.

4. The circuit of claim 3, wherein the first phase and the third phase of the five-phase clock are the two control signals for the first TSCP, the second phase and the fourth phase of the five-phase clock are the two control signals for the second TSCP, the third phase and the fifth phase of the five-phase clock are the two control signals for the third TSCP, the fourth phase and the first phase of the five-phase clock are the two control signals for the fourth TSCP, and the fifth phase and the second phase of the five-phase clock are the two control signals for the fifth TSCP.

5. The circuit of claim 1, wherein the load comprises a parasitic capacitance.

6. The circuit of claim 1, wherein the load comprises a resonant tank comprising a parallel connection of an inductor and a capacitor.

7. The circuit of claim 6, wherein a resonant frequency of the resonant tank is five times higher than a fundamental frequency of the five-phase clock.

8. A method comprising:
   receiving a five-phase clock including a first phase, a second phase, a third phase, a fourth phase, and a fifth phase;
   using a first tri-state charge pump (TSCP) to output a first current to an output node in accordance with the first phase and the third phase of the five-phase clock;
   using a second TSCP to output a second current to the output node in accordance with the second phase and the fourth phase of the five-phase clock;
   using a third TSCP to output a third current to the output node in accordance with the third phase and the fifth phase of the five-phase clock;
   using a fourth TSCP to output a fourth current to the output node in accordance with the fourth phase and the first phase of the five-phase clock;
   using a fifth TSCP to output a fifth current to the output node in accordance with the fifth phase and the second phase of the five-phase clock; and
   terminating the output node with a load.

9. The method of claim 8, wherein the first TSCP, the second TSCP, the third TSCP, the fourth TSCP, and the fifth TSCP are all embodied by a charge pump circuit that has three states including a negative output current state, a positive output current state, and a zero output current state in accordance with two control signals, each of which is a logical signal that is either in a first logical state or in a second logical state.

10. The method of claim 9, the charge pump circuit is in the negative output current state when the two control signals are both in a first logical state, in the positive output current state when the two control signals are both in a second logical state, and otherwise in the zero output current state.

11. The method of claim 10, wherein the first phase and the third phase of the five-phase clock are the two control signals for the first TSCP, the second phase and the fourth phase of the five-phase clock are the two control signals for the second TSCP, the third phase and the fifth phase of the five-phase clock are the two control signals for the third TSCP, the fourth phase and the first phase of the five-phase clock are the two control signals for the fourth TSCP, and the fifth phase and the second phase of the five-phase clock are the two control signals for the fifth TSCP.

12. The method of claim 8, wherein the load comprises a parasitic capacitance.

13. The method of claim 8, wherein the load comprises a resonant tank comprising a parallel connection of an inductor and a capacitor.

14. The method of claim 13, wherein a resonant frequency of the resonant tank is five times higher than a fundamental frequency of the five-phase clock.

* * * * *